(12) United States Patent
Wood et al.

(10) Patent No.: US 9,972,551 B2
(45) Date of Patent: May 15, 2018

(54) SYSTEM AND METHOD FOR DUAL-REGION SINGULATION

(71) Applicant: Infineon Technologies Austria AG, Villach (AT)

(72) Inventors: Andrew Christopher Graeme Wood, St.Jakob i. Rosental (AT); Gernot Fasching, Villach (AT); Marius Aurel Bodea, Villach (AT); Thomas Krotscheck Ostermann, Koestenberg (AT); Erwin Bacher, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days. days.

(21) Appl. No.: 15/403,673

(22) Filed: Jan. 11, 2017

(65) Prior Publication Data

US 2017/0125315 A1 May 4, 2017

Related U.S. Application Data

(62) Division of application No. 14/660,753, filed on Mar. 17, 2015, now Pat. No. 9,583,406.

(51) Int. Cl.
| | |
|---|---|
| *H01L 23/48* | (2006.01) |
| *H01L 23/52* | (2006.01) |
| *H01L 29/40* | (2006.01) |
| *H01L 21/66* | (2006.01) |
| *H01L 21/78* | (2006.01) |
| *G06F 17/50* | (2006.01) |

(Continued)

(52) U.S. Cl.
CPC .......... *H01L 22/34* (2013.01); *G06F 17/5072* (2013.01); *H01L 21/78* (2013.01); *H01L 22/14* (2013.01); *H01L 22/32* (2013.01); *H01L 23/485* (2013.01); *H01L 23/4827* (2013.01); *H01L 23/528* (2013.01); *H01L 23/53271* (2013.01); *H01L 23/585* (2013.01); *H01L 24/05* (2013.01); *H01L 2224/0518* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05157* (2013.01); *H01L 2224/05164* (2013.01); *H01L 2224/05166* (2013.01); *H01L 2224/05169* (2013.01); *H01L 2224/05172* (2013.01); *H01L 2224/05184* (2013.01); *H01L 2924/1203* (2013.01); *H01L 2924/1305* (2013.01); *H01L 2924/13055* (2013.01); *H01L 2924/13091* (2013.01); *H01L 2924/14* (2013.01); *H01L 2924/146* (2013.01)

(58) Field of Classification Search
CPC .......................... H01L 27/124; H01L 23/5286
USPC .................................................. 257/784, 786
See application file for complete search history.

(56) References Cited

U.S. PATENT DOCUMENTS

| | | | | |
|---|---|---|---|---|
| 6,175,394 B1* | 1/2001 | Wu | ................... | G02F 1/136204 257/360 |
| 2008/0017979 A1* | 1/2008 | Chang | ............... | H01L 21/76838 257/734 |

(Continued)

*Primary Examiner* — S. V. Clark
(74) *Attorney, Agent, or Firm* — Slater Matsil, LLP

(57) ABSTRACT

A semiconductor die includes a semiconductor circuit disposed within or over a substrate. A conductive contact pad is disposed over the substrate outside the semiconductor circuit. A floating electrical path ends at a singulated edge of the die. The electrical path is electrically coupled to the conductive contact pad.

19 Claims, 10 Drawing Sheets

(51) Int. Cl.
  *H01L 23/528* (2006.01)
  *H01L 23/532* (2006.01)
  *H01L 23/00* (2006.01)
  *H01L 23/482* (2006.01)
  *H01L 23/485* (2006.01)
  *H01L 23/58* (2006.01)

(56) References Cited

U.S. PATENT DOCUMENTS

| | | |
|---|---|---|
| 2008/0277659 A1 | 11/2008 | Hsu et al. |
| 2008/0297501 A1* | 12/2008 | Miyazawa ............ G09G 3/3677 345/213 |
| 2013/0221353 A1 | 8/2013 | Yang et al. |
| 2014/0167226 A1 | 6/2014 | Miccoli et al. |
| 2014/0264767 A1 | 9/2014 | Gratz et al. |
| 2016/0276233 A1 | 9/2016 | Wood et al. |

* cited by examiner

SYSTEM AND METHOD FOR DUAL-REGION SINGULATION

CROSS-REFERENCE TO RELATED APPLICATIONS

This application is a divisional of U.S. application Ser. No. 14/660,753, filed on Mar. 17, 2015, which application is hereby incorporated herein by reference.

TECHNICAL FIELD

The present invention relates generally to a system and method for singulation of semiconductors, and, in particular embodiments, to a system and method for dual-region singulation.

BACKGROUND

Process Control Monitoring (PCM) structures are semiconductor monitoring structures that can be used prior to singulating a semiconductor wafer into individual die. Monitoring with PCM structures can help determine whether fabrication processes are within appropriate process windows or whether individual devices that make up an Integrated Circuit (IC) are within device specifications.

Existing PCM systems, however, present cost and performance disadvantages by placing PCM structures and their conductive contact pads in the same region. For example, in block PCM designs, a region of the wafer that would otherwise be used to form a semiconductor chip is used to form one or more PCM structures and contact pads thereby reducing the number of chips per wafer. For wafers with only a few large semiconductor chips, these block PCM designs sacrifice a large fraction of the productive part of the wafer. Thus, when large semiconductor chips are used, PCM structures and their contact pads are often placed within the lanes where the dies are singulated. Yet singulating through metal pads can introduce imperfections that reduce production yield and create reliability problems for the semiconductor chips that are produced. For example, when mechanical sawing is used to singulate the die, vibrations introduced through the combination of metallic and non-metallic materials that differ in hardness can cause cracks, cavities, or other forms of surface and/or sidewall damage. Furthermore, because metallic and non-metallic materials exhibit different thermal behavior, singulating with a laser introduces material stresses due to dissimilar heating.

SUMMARY

In accordance with an embodiment of the present invention, a semiconductor die is provided. The semiconductor die includes a semiconductor circuit, a conductive contact pad, and a floating electrical path ending at a singulated edge of the die, wherein the electrical path is electrically coupled to the conductive contact pad.

In accordance with another embodiment of the present invention, a method for semiconductor fabrication is provided. The method includes forming a first array of semiconductor circuitry and a second array of semiconductor circuitry separated by a singulation region and a contact region. The method also includes forming a first array of PCM structures within the singulation region of a substrate. The method also includes forming a first array of contact pads disposed in the contact region. The method also includes forming electrical connections between the first array of PCM structures and the first array of contact pads, wherein all external electrical connections to the first array of PCM structures are made through the first array of contact pads.

In accordance with another embodiment of the present invention, another method for semiconductor fabrication is provided. The method includes forming a PCM structure in a semiconductor wafer comprising a complete set of singulation regions for singulating through the semiconductor wafer, wherein the PCM structure is disposed within the complete set. The method also includes forming a conductive contact pad in the semiconductor wafer, wherein the conductive contact pad is electrically coupled to the PCM structure, and the conductive contact pad is not disposed within the complete set. The method also includes singulating the semiconductor wafer only within the complete set of singulation regions.

In accordance with another embodiment of the present invention, a method for layout generation is provided. The method includes obtaining a layout location of a singulation region for singulating through a semiconductor wafer, wherein the layout location is included in a layout representing the semiconductor wafer. The method also includes obtaining a design for a PCM structure and selecting an arrangement for the layout. The arrangement includes a first array of PCM structures each arranged in accordance with the design for the PCM structure, wherein the first array of PCM structures is disposed within the singulation region. The arrangement also includes a first array of contact pads disposed in a contact region, a first array of semiconductor circuitry and a second array of semiconductor circuitry separated by the singulation region and the contact region, and electrical connections between the first array of PCM structures and the first array of contact pads. All external electrical connections to the first array of PCM structures are made through the first array of contact pads.

BRIEF DESCRIPTION OF THE DRAWINGS

For a more complete understanding of the present invention, and the advantages thereof, reference is now made to the following descriptions taken in conjunction with the accompanying drawings, in which.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. An exemplary wafer containing dies that are to be singulated through PCM structures will first be generally described in connection with FIG. 1. More detail will then be provided for an embodiment in which a PCM structure and contact pads are located in a horizontal separating region of a wafer in connection with FIG. 2. The cross-section of this horizontally-distributed PCM structure will be further explained in connection with FIG. 3. A method for generating a layout design for a semiconductor wafer having PCM structures and contact pads will be discussed in connection with FIG. 4. A method for fabricating the semiconductor wafer from the layout will be discussed in connection with FIG. 5. Finally, a processing system used for implementing some of the embodiment devices and methods will be described in connection with FIG. 6.

The present invention will be described with respect to embodiments in a specific context, a system and method for placing PCM structures and contact pads for use in monitoring particular features of a fabrication process, including physical characteristics such as line width, gate profile, contact opening, and other such as, for example, doping, resistance, capacitance, transistor performance, and others. Further embodiments may be applied to other PCM systems for measuring system and circuit level performance of one or more individual devices used to make up a complete semiconductor chip.

Figure 1A:
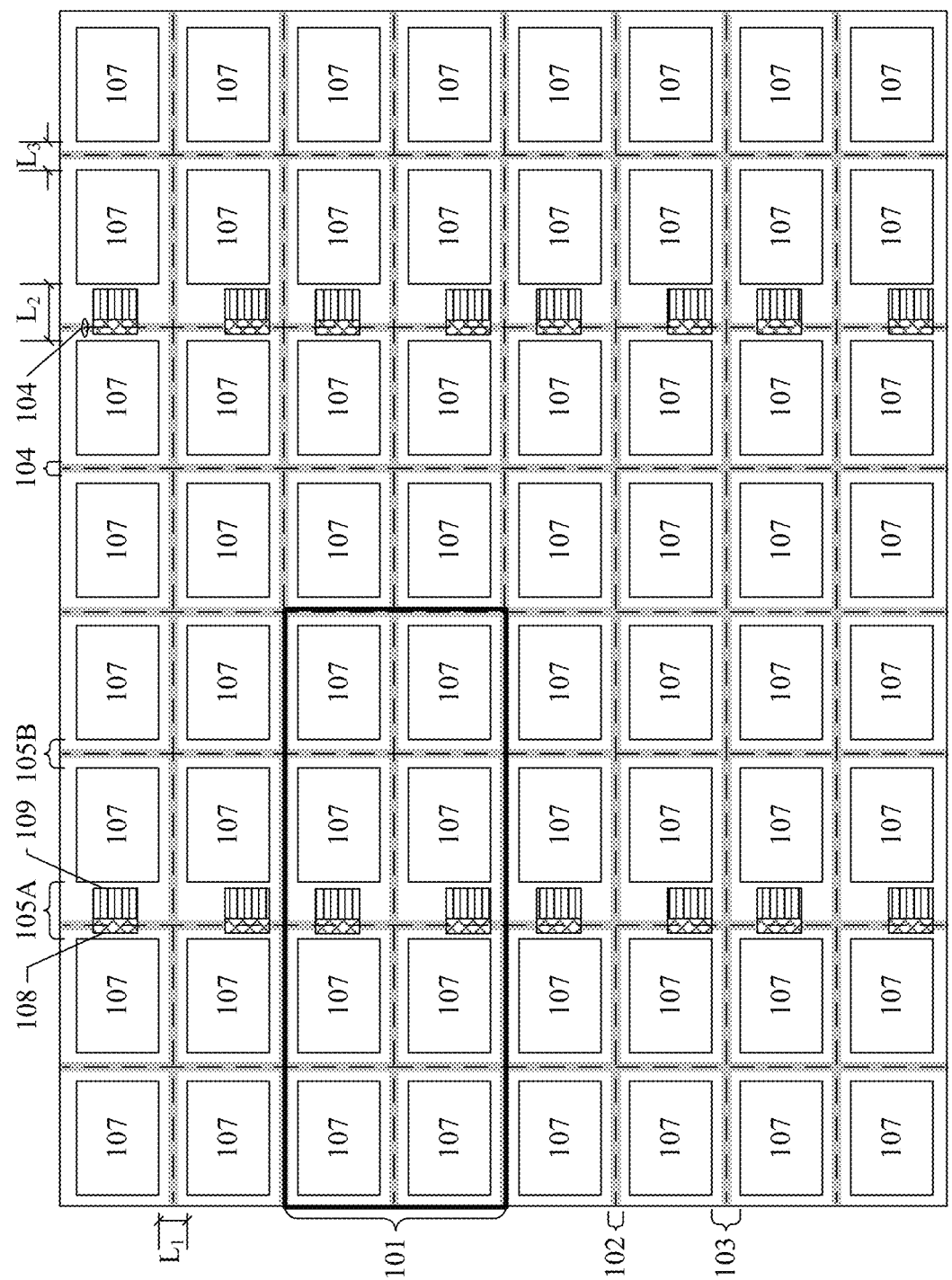
FIGS. 1A-1E are block diagrams illustrating a top view of a semiconductor wafer to be singulated in accordance with embodiments of the present invention.
Figure 1B:
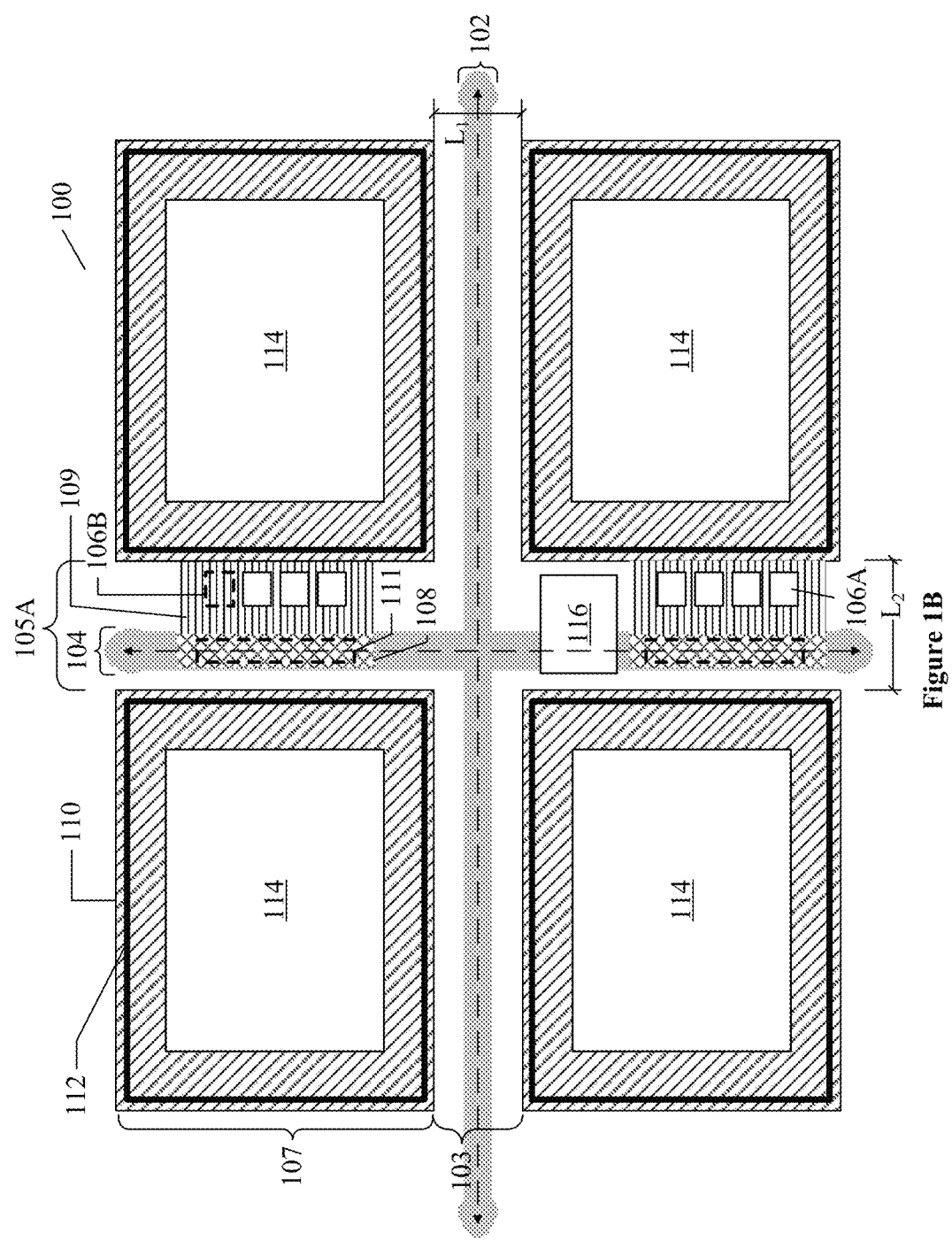
Figure 1C:
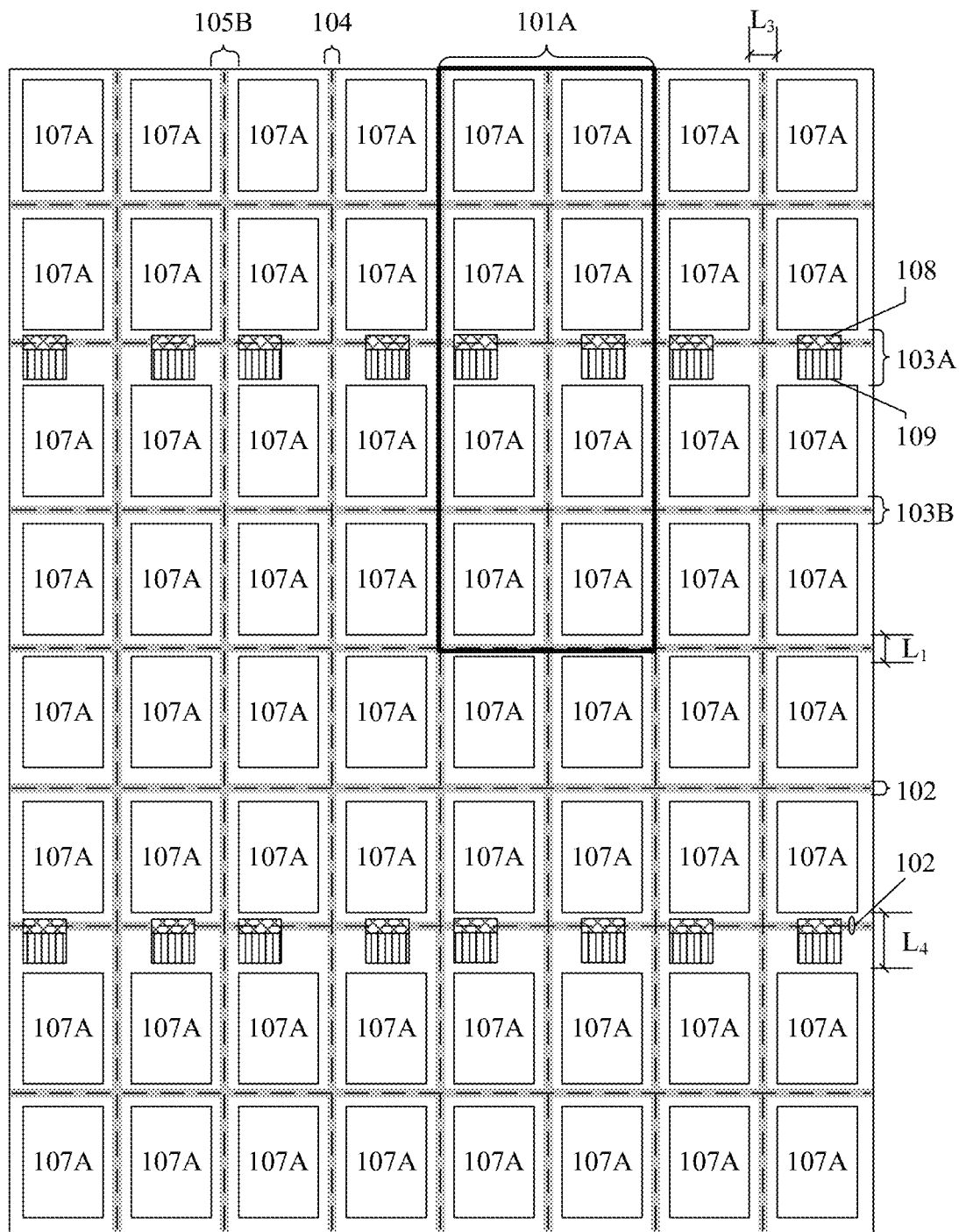
Figure 1D:
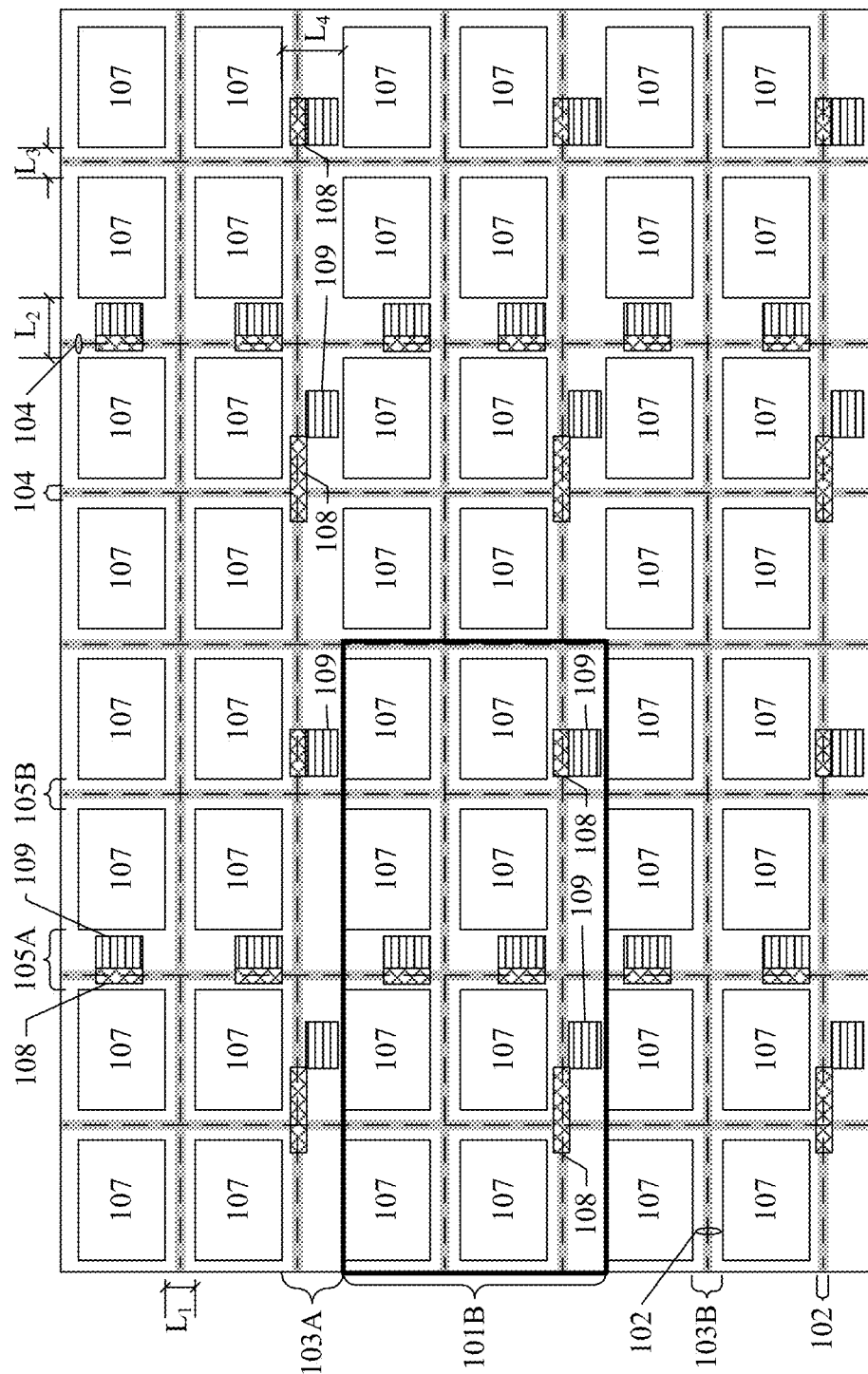
Figure 1E:
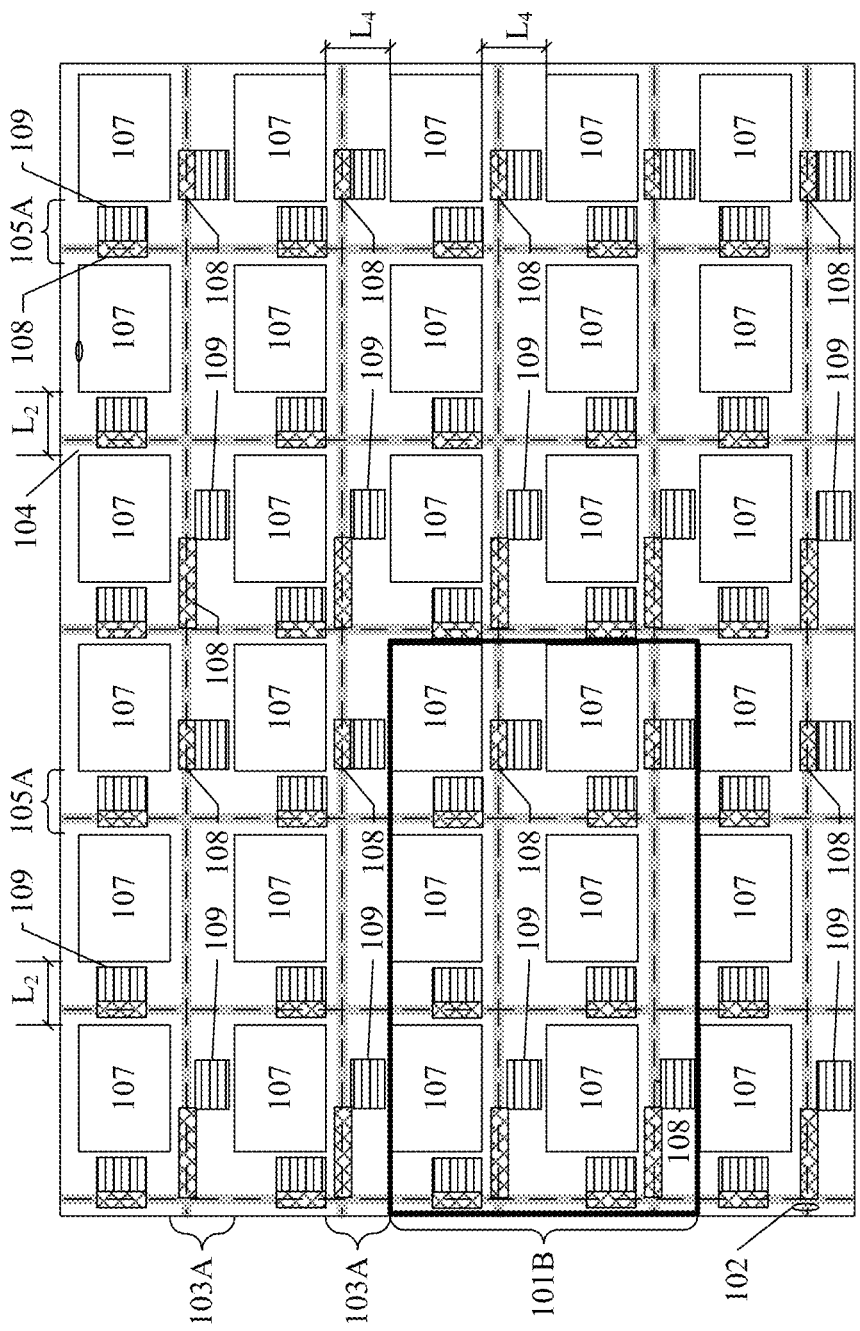

FIG. 1, which includes FIGS. 1A-1E, shows dual regions for implementing embodiment PCM structures and contact pads in a semiconductor wafer to be singulated. FIG. 1A is a top view of an embodiment semiconductor wafer having PCM structures in vertical separation regions between semiconductor circuit regions. FIG. 1B is a zoomed-in view of an exemplary section of the semiconductor wafer of FIG. 1A that includes only four design repetitions. FIG. 1C is a top view of an alternative embodiment having PCM structures in horizontal separation regions. FIG. 1D is a top view of another alternative embodiment having PCM structures in both horizontal and vertical separation regions. FIG. 1E is a top view of another alternative embodiment having PCM structures in all vertical separating regions and all horizontal separating regions.

Referring now to FIG. 1A, a semiconductor wafer has semiconductor circuit regions 107, and these semiconductor circuit regions 107 are to be separated from each other by singulating through singulation lanes lying in separation regions between the semiconductor circuit regions 107. These singulation lanes are three-dimensional regions extending from the top to the bottom of the wafer. Singulation may be performed by, for example, mechanical sawing, laser cutting, or another separation technique. The embodiment semiconductor wafer of FIG. 1A has metal widths of less than or equal to 20 μm in the singulation lanes. Horizontal singulation lanes 102 lie in horizontal separation regions 103, and vertical singulation lanes 104 lie in wide vertical separation regions 105A and ordinary vertical separating regions 105B.

The semiconductor circuit regions 107 may include circuitry for, e.g., vertical power Metal Oxide Semiconductor Field-Effect Transistors (MOSFETs), other power transistors, or power chips; diodes; sensors; microprocessors or other integrated circuits including Very Large Scale Integration (VLSI), Small-Scale Integration (SSI), Medium-Scale Integration (MSI), or Ultra-Large-Scale Integration (ULSI) chips; bipolar transistors, or Insulated-Gate Bipolar Transistors (IGBTs).

The minima for the width $L_1$ of the horizontal separating regions 103 and the width $L_3$ of the ordinary vertical separating regions 105B are both dependent on manufacturing tolerances for singulation and in some embodiments these widths may be the same. The minimum for the width $L_2$ of each wide vertical separating region 105A is increased to approximately twice the width $L_3$ of an ordinary vertical separating region 105B to accommodate PCM regions 108 for locating PCM structures and pad regions 109 for locating contact pads. In some embodiments, $L_2$ is less than twice $L_3$ since singulation width tolerances can be at least partially integrated into the pad regions 109. In some embodiments, all vertical separating regions are widened to accommodate PCM regions 108 and pad regions 109 or to provide a constant stepping pitch to reduce complexity of equipment for singulating the wafer.

A lithographic process uses quartz plate reticles or photomasks to form the structures of the wafer. Although wafer structures formed by stepper lithography are depicted in FIG. 1A, other embodiments use mask aligner lithography in which a full wafer photomask forms an image on the entire wafer in a single exposure. In stepper lithography embodiments, a reticle will form an image on, for example, 1/100 or 1/50 of the wafer surface, and this pattern is a design repetition that is stepped across the wafer using a stepper. In the embodiment wafer of FIG. 1A, only eight such design repetitions 101 appear, and only eight semiconductor circuit regions 107 appear in each design repetition 101. In some embodiments the design repetition 101 can be stepped across the entire wafer over one hundred times and the semiconductor circuit region 107 can appear over one hundred times in each design repetition 101. In the embodiments of FIGS. 1A and 1B, fewer wide vertical separating regions 105A appear than semiconductor circuit regions 107 because the PCM regions 108 appear less frequently in each design repetition 101 than the semiconductor circuit regions 107. Other embodiment wafers have an equal number of widened separating regions and semiconductor circuit regions. A given wafer design may use a series of reticles to form different layers of the semiconductor circuit regions at different stages of the fabrication process. The layout of the reticles may be generated using, for example, Computer Aided Design (CAD).

In some embodiments, the layout will include multiple design repetitions with distinct arrangements of PCM structures, contact pads, electrical paths and interconnects. For example, a first arrangement may be laid out in a region of the semiconductor wafer that is to be singulated first, and a second distinct arrangement may be laid out in a region of the semiconductor wafer that is to be singulated later. In an embodiment, the first arrangement may be useful for mitigating formation of cracks that are more likely to form in regions that are to be singulated first. The first design may, for example, form PCM structures and contact pads in a first arrangement that optimally mitigates crack formation, for example, by using a lower metal content in the vertical singulation lane 104. The second design may offer other advantages such as, for example, decreasing resistance by using more metal interconnects to electrically couple connections pads to PCM structures.

Referring now to FIG. 1B, a top sectional view shows an exemplary wafer section 100 of the semiconductor wafer that includes regions for implementing embodiment PCM structures 111. One of ordinary skill would recognize that PCM structures 111 may include a wide variety of structures used for PCM such as, for example, capacitors, resistors, contact resistance structures, diodes, MOSFETs, bipolar transistors, IGBTs, heaters, isolation check structures, reliability test structures, layer stack structures, etc. For wafer technologies based on silicon, silicon carbide, silicon germanium, carbon (including graphene) or similar semiconductor materials, the PCM structures may be made of any of the foregoing materials, or materials derived therefrom, e.g., oxides, nitrides, or imides of the foregoing materials, polycrystalline silicon, or other derivative dielectric materials. Other embodiments using wafer technologies based on III-V or II-VI compound semiconductor substrates could use PCM structures that are also based on one or more of the elements that make up the substrate. Such III-V and II-VI compound substrates may include, for example, gallium nitride, gallium arsenide, indium arsenide, gallium phosphide, indium phosphide, aluminum arsenide, aluminum nitride, cadmium sulfide, zinc sulfide, cadmium telluride, and zinc telluride. In still other embodiments, similar to the semiconductor circuit regions 107 being monitored the PCM structures could also contain small amounts of metal or metallic compounds (less than 5%) such as, e.g., aluminum, copper, titanium, tungsten, cobalt, platinum, palladium, molybdenum, nickel, vanadium, silver, gold, and metal silicides, metal nitrides and alloys of the foregoing metals. By contrast, as illustrated in FIG. 1B, the surface contact pads 106A and buried contact pads 106B could be made entirely of these metals and metallic compounds.

Referring again to FIG. 1B, the four quadrants of the exemplary wafer section 100 are four dies that are to be singulated, i.e., separated, at horizontal singulation lane 102 and vertical singulation lane 104 to produce four semiconductor chips. Each quadrant of the wafer section 100 contains a semiconductor circuit region 107 to be assembled into a packaged semiconductor product. Each semiconductor circuit region 107 contains an active region 114 and a seal-ring 110. The seal-ring no is part of the termination structure surrounding the active region 114 and protects the active region 114 from problems caused by, e.g., ElectroStatic Discharge (ESD) and by damage from singulation, for example, from cracks caused by mechanical sawing. The seal-ring no may include a crack stop region 112 that includes a gap on the top insulating layer of the wafer and is designed to prevent any cracks or chips which form on the singulation surface from propagating into the active region 114. The seal-ring no may also include a moisture barrier to prevent moisture from entering into the active region 114.

Referring again to FIG. 1B, the wide vertical separating regions 105A of the wafer are widened to accommodate PCM structures in (which are present in PCM regions 108) along with surface contact pads 106A and buried contact pad 106B, which are present in distinct pad regions 109. Each pad region 109 may be adjacent to a PCM region 108, as an example. Surface contact pads 106A and buried contact pad 106B are used for connecting external monitoring devices to the PCM structures 111. In the embodiment wafer of FIG. 1B, any connections to buried contact pad 106B are performed in a step prior to its burial beneath the wafer surface, while connections to surface contact pads 106A may still be performed since these pads are never buried. Surface contact pads 106A and buried contact pad 106B are made of electrically conductive material.

External monitoring devices can monitor the PCM structures 111 by connecting to the surface contact pads 106A (and buried contact pad 106B prior to burial) using, for example, conductive probe needles. In an embodiment, the surface contact pads 106A and buried contact pad 106B are made of the same metallic layer that will be used after singulation to make power metal bond connections to the top surface of each die from, for example, a bond wire of a sealed package containing the singulated die. In some embodiments, the contact pads have dimensions of the order of 50 µmm×50 µm in order to enable consistent connection with the probe needles.

In the embodiment of FIG. 1B, the PCM regions 108 lie within a vertical singulation lane 104. Because the surface contact pads 106A and buried contact pad 106B are in a region that is separate from the vertical singulation lane 104, any metal structures present in the vertical singulation lane 104 have metal widths of less than or equal to 20 µm, which is less than the minimum width needed to enable consistent connection with a test probe. In some embodiments, any metal structures that are present in any of the horizontal or vertical singulation lanes and that are also electrically coupled to a PCM structure have metal widths that are narrower than the width of the tip of a test probe. By reducing the metal content of the vertical singulation lane 104, damage to the die during singulation is avoided. In other embodiments, PCM structures 111 are present in horizontal singulation lanes 102 that lack metal structures wider than 20 µm, or in both horizontal and vertical singulation lanes that each lack metal structures wider than 20 µm.

In the embodiment of FIG. 1B, placement of the PCM regions 108 within a vertical singulation lane 104 allows the PCM structures 111 to be destroyed during singulation, which prevents unauthorized connection to the PCM structures of finished products and reverse engineering of the fabrication process. In other embodiments, PCM regions 108 are located in a horizontal singulation lane to prevent reverse engineering. In still other embodiments for applications in which reverse engineering is less of a concern, the PCM region 108 is not within a horizontal singulation lane 102 or a vertical singulation lane 104.

The embodiment of FIG. 1B also contains a materials measurement block 116 in the vertical separating regions 105 that can be used for other aspects of process monitoring. In other embodiments, the separating region also contains alignment structures that allow a feature on one layer of the wafer to be aligned with a target structure being formed. The materials measurement block 116 of FIG. 1B may include an oxide measurement region that contains a block of oxide upon which a thickness measurement can be made using an interferometer. The materials measurement block 116 may also contain a doping measurement region for monitoring doping levels indicative of the various regions of the wafer, for example, using scanning capacitance measurement and destructive techniques including spreading resistance measurement, secondary ion mass spectrometry, and others.

Referring now to FIG. 1C, in an alternative embodiment, wide horizontal separating regions 103A are widened relative to ordinary horizontal separating regions 103B to accommodate PCM regions 108 and pad regions 109 of an alternative design repetition 101B. The minimum for the width $L_4$ of each wide horizontal separating region 103A is increased to approximately twice the width $L_1$ of an ordinary horizontal separating region 103B to accommodate PCM regions 108 for locating PCM structures and pad regions 109 for locating contact pads. In some embodiments, $L_4$ is less than twice $L_1$ since singulation width tolerances can be at least partially integrated into the pad regions 109. In other embodiments, all horizontal separating regions are widened. The aspect ratio of the semiconductor circuit region may be a factor in selecting whether horizontal or vertical separating regions are widened. For example, in the embodiment of FIG. 1C, the top surface of semiconductor circuit region 107A has a greater vertical dimension than horizontal dimension.

Referring now to FIG. 1D, in a second alternative embodiment both wide vertical separation regions 105A and wide horizontal separating regions 103A are respectively widened relative to ordinary vertical separation regions 105B and ordinary horizontal separation regions 103B to accommodate PCM regions 108 and pad regions 109. In other embodiments, all horizontal separation regions are widened while only some vertical separation regions are widened, or vice versa.

Referring now to FIG. 1E, in a third alternative embodiment all vertical separating regions 105A and all horizontal separating regions 103A are respectively widened relative to ordinary vertical separation regions 105B and ordinary horizontal separation regions 103B (shown in FIG. 1D) to accommodate PCM regions 108 and pad regions 109.

Figure 2A:
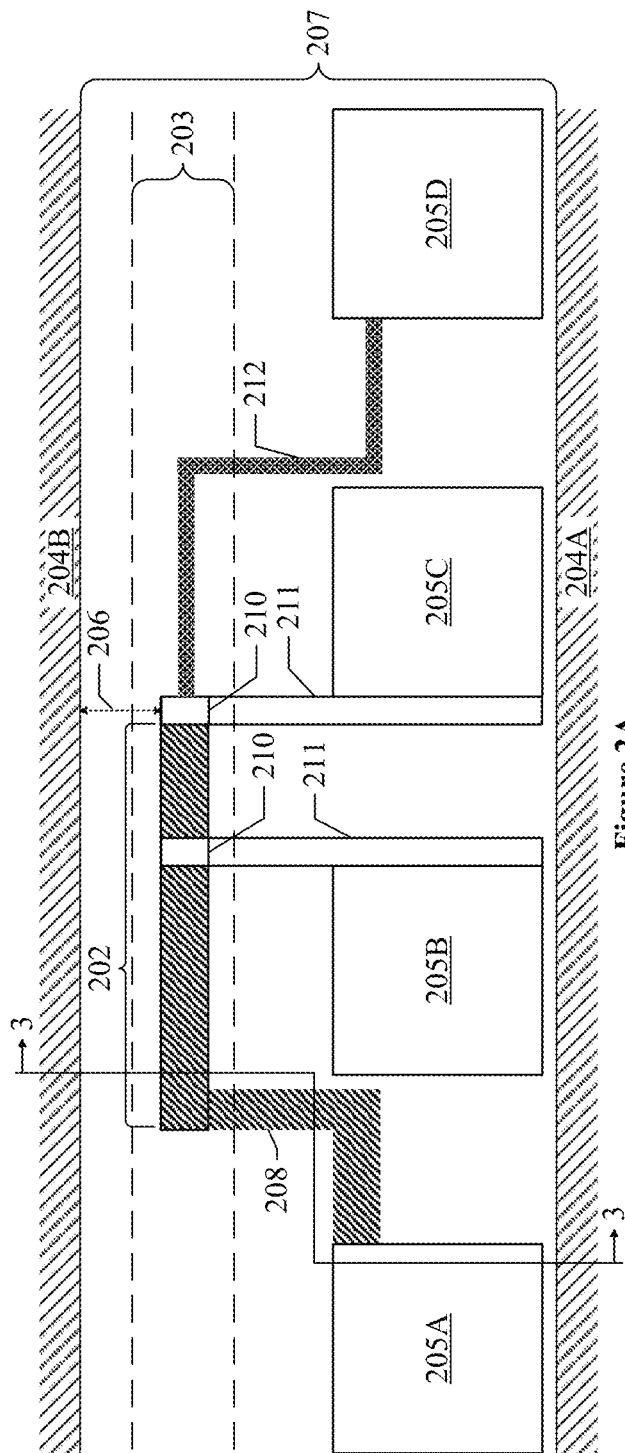
FIGS. 2A and 2B are block diagrams illustrating an embodiment PCM structure and contact pads located in a horizontal separating region of a wafer in accordance with embodiments of the present invention.
Figure 2B:
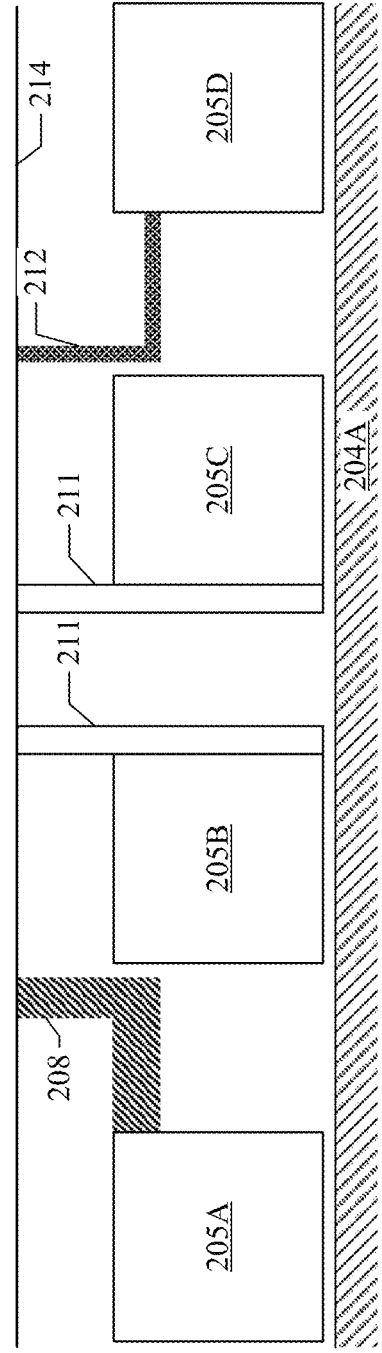

FIG. 2, which includes FIGS. 2A and 2B, shows a top sectional view of an embodiment PCM structure and contact pads located in a horizontal separating region 207 of a wafer. FIG. 2A shows the wafer before singulation, and FIG. 2B shows a single die of the wafer after singulation.

Referring now to FIG. 2A, an embodiment PCM structure 202 includes a polysilicon resistor near the top surface of a wafer in a horizontal singulation lane 203 between two semiconductor circuit regions 204A-B. Contact pads 205A-D are electrically coupled to the PCM structure 202 by a polysilicon path 208, metal traces 211, and a silicon path 212 forming electrical paths. The PCM structure 202 is also electrically coupled to semiconductor circuit region 204B via an electrical path 206 that is embedded below the wafer surface. In other embodiments, a PCM structure may be coupled to a semiconductor circuit region by a surface path. In still other embodiments, a single PCM structure may be coupled to multiple semiconductor circuit regions.

Contact pad 205A is electrically coupled to the PCM structure 202 by a polysilicon path 208. Polysilicon provides an electrical path with a higher resistance than a metallic conductor, but beneficially reduces the metal content of the singulation lane 203. Such polysilicon connections may be used in embodiment applications where the PCM measurements have higher contact resistance tolerances.

A metallic conductor coupled to a PCM structure may also be used for sensitive measurements, for example, sensitive resistance measurements. For instance, in the particular embodiment of FIG. 2A the direct metal interconnects 210 are electrically coupled to the contact pads 205B and 205C using metal traces 211. In an embodiment, the metallic conductor is made as narrow as possible to reduce the metal content in the singulation region, while still being wide enough to not introduce excess resistance to the measurement. In an embodiment, the metallic conductor is made of the same material as the contact pad.

An electrical path from a contact pad to a PCM structure may also be made from the same material as the wafer substrate by providing isolation on either side of the semiconductor path using, for example, deep trench isolation. For example, in the embodiment of FIG. 2A, a silicon path 212 disposed in the wafer substrate electrically couples the contact pad 205D to the PCM structure 202.

In some wafers, different electrical paths between the contact pads and the PCM structures are designed to be composed of different materials. For example, in one embodiment wafer design, 42% of these electrical paths are composed of metal, and the remaining 58% are composed of a semiconductor material, such as polysilicon or the same material as the wafer substrate. In various embodiments, at least 50% of the electrical paths between the contact pads and the PCM structures are composed of a semiconductor material. In still other embodiments, at least 50% of the electrical paths between the contact pads and the PCM structures are composed of metal.

FIG. 2B shows the die of FIG. 2A after singulation along the singulation lane 203. Each of the contact pads 205A-D of FIG. 2B has no connection to any semiconductor circuit region and has a conductive connection that ends at the singulated edge 214 of the die. For example, contact pads 205B-C each have a metal trace 211 that ends at the singulated edge 214. Pad 205A has a polysilicon path 208 that ends at the singulated edge 214. Contact pad 205D has a silicon connection 212 that ends at the singulated edge 214.

Figure 3:
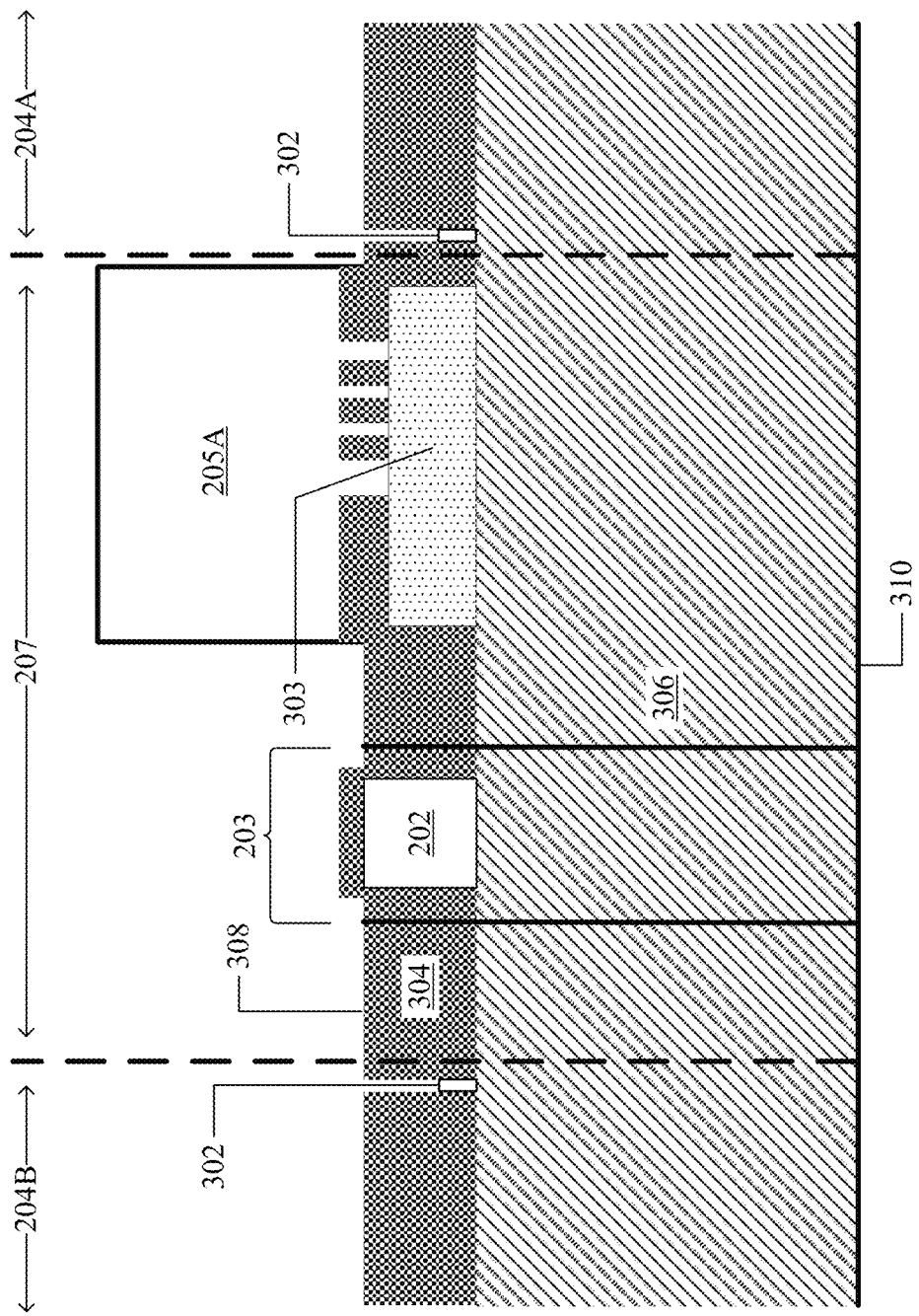
FIG. 3 is a block diagram illustrating a cross-section of the PCM structure and one of the contact pads of FIG. 2A.

FIG. 3 shows a cross-section of the PCM structure 202 and contact pad 205A of FIG. 2A, both of which lie in a horizontal separating region 207 between the two semiconductor circuit regions 204A and 204B. Each of the semiconductor circuit regions has a crack stop 302 near its edge. The contact pad 205A contacts an underlying polysilicon region 303, which is partially embedded in an insulating layer 304 and is above the remaining wafer layers 306. A thin portion of the insulating layer 304 also covers the PCM structure 202 within the horizontal singulation lane 203. In other embodiments, a PCM structure is exposed to the top surface 308 and is not covered by any layers. In still other embodiments, a PCM is buried down to a depth of several microns. The horizontal singulation lane 203 is a three-dimensional region for singulating through the semiconductor wafer. The horizontal singulation lane 203 intersects the PCM structure 202 and also intersects the top surface 308 and the bottom surface 310, but does not intersect the contact pad 205A.

Figure 4:
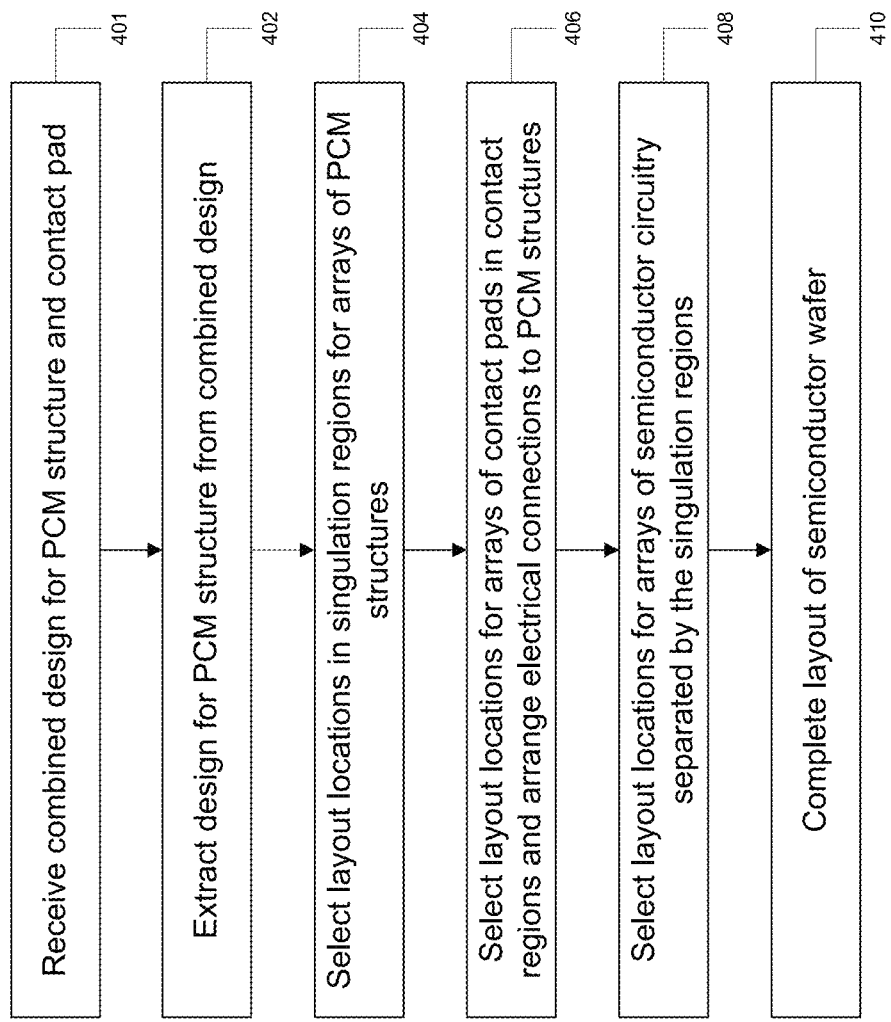
FIG. 4 is a flow diagram illustrating a method for generating a layout design of a semiconductor wafer in accordance with embodiments of the present invention.

FIG. 4 is a flow diagram illustrating an embodiment method for generating a layout design of a semiconductor wafer using, for example, a CAD software application. At step 401, a combined design for a PCM structure and a conductive contact pad is received. The combined design may also include a list of sensitive devices that need to be connected only with metal lines. At step 402, the design for the PCM structure is extracted from the combined design such that the extracted design for the PCM structure lacks metal structures wider than 20 µm. At step 404, layout locations are selected for arrays of PCM structures arranged in accordance with the extracted design. These layout locations are selected such that the arrays of PCM structures are within the singulation lanes. At step 406, layout locations for arrays of contact pads are selected such that singulating through the singulation lanes would not include singulating through the contact pads. Each PCM structure in arrays of PCM structures may be, for example, adjacent to at least one contact pad in the arrays of contact pads. The layout generator also receives the technology specification providing various rules that need to be taken into account while generating the layout. One of the rules in the technology specification may include the maximum total metal content allowable for a singulation lane to minimize cracks and other effects. Some embodiments may include a minimum total metal content so that sensitive components are connected with metal lines. The layout may design the contact pad to be contiguous with a metallization layer of the semiconductor wafer. Electrical connections are laid out to couple the PCM structures to the contact pads such that all external electrical connections to the PCM structures are made through the contact pads. These electrical connections may be designed from polysilicon, metal, or the material that makes up the semiconductor substrate, but the electrical connections use non-metallic interconnects as much as possible as allowed in the technology specification. At step 408, layout locations for arrays of semiconductor circuitry are selected such that the arrays of semiconductor circuitry are separated by the singulation regions. At step 410, the remainder of the layout for the semiconductor wafer is completed.

Figure 5:
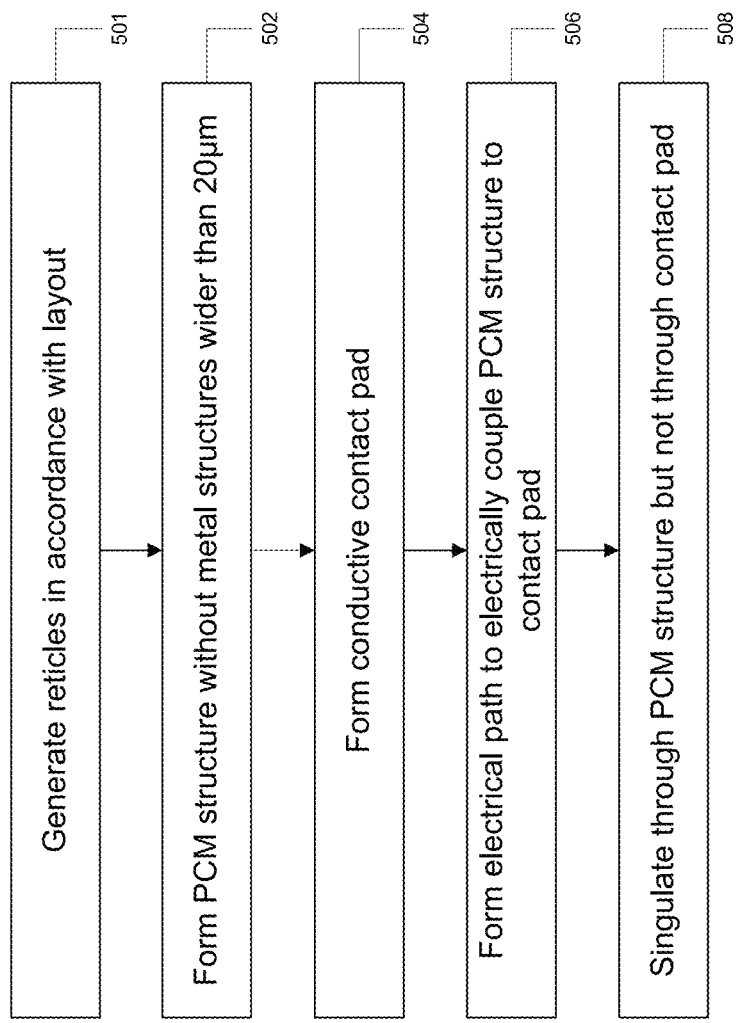
FIG. 5 is a flow diagram illustrating a method for fabricating a semiconductor wafer in accordance with embodiments of the present invention.

FIG. 5 is a flow diagram illustrating an embodiment method for semiconductor fabrication. At step 501, at least one reticle is generated in accordance with a layout design for a semiconductor wafer. At step 502, a PCM structure is formed in accordance with the at least one reticle such that the PCM structure does not include metal structures wider than 20 µm and the PCM structure is intersected by a singulation lane. The PCM structure may be disposed between semiconductor circuit regions of the wafer, as an example. At step 504, a conductive contact pad is formed in accordance with the at least one reticle such that the contact pad is not intersected by the singulation lane. The PCM structure and contact pad may be adjacent to each other, as an example. The contact pad may be formed from a metallization layer of the semiconductor wafer. At step 506, an electrical path such as, for example, a polysilicon path, metal path, or a path made of the substrate material, is formed to electrically couple the PCM structure and the conductive contact pad. At step 508, the semiconductor wafer is singulated through the PCM structure but not through the contact pad. This singulating the wafer into a plurality of dies may damage the PCM structure without damaging the contact pad.

Figure 6:
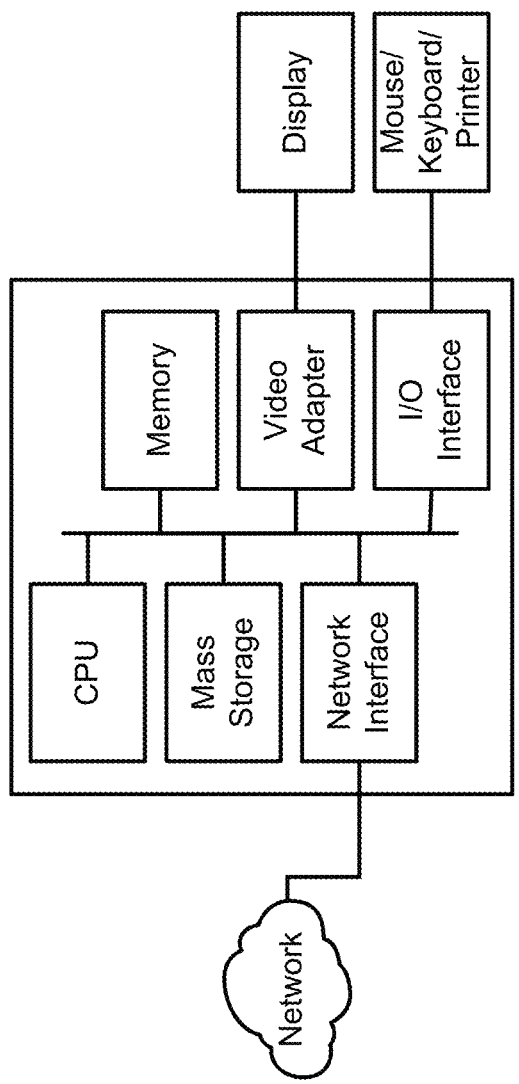
FIG. 6 is a block diagram illustrating a processing system that may be used for implementing some of the devices and methods disclosed herein in accordance with embodiments of the present invention.

FIG. 6 shows a block diagram of a processing system that may be used for implementing the layout generation methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. In an embodiment, the processing system comprises a computer workstation. The processing system may comprise a processing unit equipped with one or more input/output devices, such as a speaker, microphone, mouse, touchscreen, keypad, keyboard, printer, display, and the like. The processing unit may include a CPU, memory, a mass storage device, a video adapter, and an Input/Output (I/O) interface connected to a bus. In an embodiment, multiple processing units in a single processing system or in multiple processing systems may form a distributed processing pool or distributed editing pool.

The mass storage device may comprise any type of storage device configured to store data, programs, and other information and to make the data, programs, and other information accessible via the bus. The mass storage device may comprise, for example, one or more of a solid state drive, hard disk drive, a magnetic disk drive, an optical disk drive, or the like.

Illustrative embodiments of the present invention have the advantage of providing increased reliability without increasing costs significantly. Embodiment dual-region structures may be used, for example, to produce semiconductor chips by mechanical dicing without introducing significant cracks. In some embodiments, the embodiment dual-region structures are used in a semiconductor wafer that is laser singulated to allow more uniform heating of the edge of the die due to reduced metal content in the singulation lane.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor die comprising:
   a semiconductor circuit disposed within or over a substrate;
   a conductive contact pad disposed over the substrate outside the semiconductor circuit; and
   a electrical path ending at a singulated edge of the die, wherein the electrical path is electrically coupled to the conductive contact pad without being electrically coupled to the semiconductor circuit.

2. The semiconductor die of claim 1, wherein the electrical path comprises a polysilicon path.

3. The semiconductor die of claim 1, wherein the electrical path comprises a substrate material of the semiconductor circuit.

4. The semiconductor die of claim 1, wherein the electrical path comprises aluminum, copper, titanium, tungsten, cobalt, platinum, palladium, molybdenum, nickel, vanadium, silver, gold, aluminum, a metal silicide, or a metal nitride.

5. The semiconductor die of claim 1, wherein the conductive contact pad comprises aluminum, copper, titanium, tungsten, cobalt, platinum, palladium, molybdenum, nickel, vanadium, silver, gold, aluminum, a metal silicide, or a metal nitride.

6. The semiconductor die of claim 1, wherein the semiconductor circuit comprises a metal oxide semiconductor field-effect transistor (MOSFET), a bipolar transistor, an insulated-gate bipolar transistor (IGBT), a diode, a sensor, or an integrated circuit.

7. A semiconductor die comprising:
   an active region comprising a semiconductor circuit disposed within or over a substrate;
   a seal-ring surrounding the active region;
   a pad region disposed on one side of the seal-ring outside the active region;
   a plurality of conductive contact pads disposed in the pad region; and
   a plurality of electrical paths ending at a singulated edge of the die, wherein each of the plurality of electrical paths extend from a contact pad of the plurality of conductive contact pads without being electrically coupled to the semiconductor circuit.

8. The semiconductor die of claim 7, wherein the plurality of electrical paths comprises polysilicon wires.

9. The semiconductor die of claim 7, wherein the plurality of electrical paths comprises a substrate material of the substrate.

10. The semiconductor die of claim 7, wherein the plurality of electrical paths comprises aluminum, copper, titanium, tungsten, cobalt, platinum, palladium, molybdenum, nickel, vanadium, silver, gold, aluminum, a metal silicide, or a metal nitride.

11. The semiconductor die of claim 7, wherein the plurality of conductive contact pads comprises aluminum, copper, titanium, tungsten, cobalt, platinum, palladium, molybdenum, nickel, vanadium, silver, gold, aluminum, a metal silicide, or a metal nitride.

12. The semiconductor die of claim 7, wherein the semiconductor circuit comprises a metal oxide semiconductor field-effect transistor (MOSFET), a bipolar transistor, an insulated-gate bipolar transistor (IGBT), a diode, a sensor, or an integrated circuit.

13. The semiconductor die of claim 7, wherein the plurality of conductive contact pads comprises surface contact pads and buried contact pad.

14. The semiconductor die of claim 7, wherein the seal-ring comprises a crack stop region that includes a gap on an uppermost insulating layer of the substrate.

15. A semiconductor die comprising:
- an active region comprising a semiconductor circuit disposed within or over a substrate;
- a seal-ring surrounding the active region;
- a first pad region disposed on a first side of the seal-ring outside the active region;
- a second pad region disposed on a second side of the seal-ring outside the active region;
- a first plurality of conductive contact pads disposed in the first pad region; and
- a first plurality of electrical paths ending at a first edge of the semiconductor die, wherein each of the first plurality of electrical paths extend from a contact pad of the first plurality of conductive contact pads without being electrically coupled to the semiconductor circuit;
- a second plurality of conductive contact pads disposed in the second pad region; and
- a second plurality of electrical paths ending at a second edge of the semiconductor die, wherein each of the second plurality of electrical paths extend from a contact pad of the second plurality of conductive contact pads without being electrically coupled to the semiconductor circuit.

16. The semiconductor die of claim 15, wherein the first side intersects with the second side.

17. The semiconductor die of claim 15, wherein the first plurality of electrical paths extend in a first direction away from the first plurality of conductive contact pads, wherein the second plurality of electrical paths extend in a second direction away from the second plurality of conductive contact pads, and wherein the first direction is perpendicular to the second direction.

18. The semiconductor die of claim 15, wherein the first and the second plurality of electrical paths comprises polysilicon wires.

19. The semiconductor die of claim 15, wherein the first and the second plurality of electrical paths comprises silicon.

* * * * *